(12) United States Patent
Inokuchi (10) Patent No.: US 12,024,768 B2
(45) Date of Patent: Jul. 2, 2024

(54) SUBSTRATE WITH FUNCTIONAL LAYER AND PROCESS FOR PRODUCING THE SAME

(71) Applicant: AGC Inc., Chiyoda-ku (JP)

(72) Inventor: Tetsuro Inokuchi, Yamagata (JP)

(73) Assignee: AGC Inc., Chiyoda-ku (JP)

( * ) Notice: Subject to any disclaimer, the term of this patent is extended or adjusted under 35 U.S.C. 154(b) by 839 days.

(21) Appl. No.: 16/745,423

(22) Filed: Jan. 17, 2020

(65) Prior Publication Data

US 2020/0231496 A1 Jul. 23, 2020

(30) Foreign Application Priority Data

Jan. 18, 2019 (JP) .................. 2019-007026

(51) Int. Cl.
| | | |
|---|---|---|
| *B32B 3/02* | (2006.01) | |
| *B32B 3/26* | (2006.01) | |
| *B32B 7/06* | (2019.01) | |
| *B32B 17/10* | (2006.01) | |

(Continued)

(52) U.S. Cl.
CPC .............. *C23C 14/34* (2013.01); *B32B 3/02* (2013.01); *B32B 3/266* (2013.01); *B32B 7/06* (2013.01);
(Continued)

(58) Field of Classification Search
CPC .......... C03C 2217/73; C03C 2217/734; C03C 2217/75; C03C 2217/76; C03C 2217/78; G02B 1/10; G02B 1/11; G02B 1/111; G02B 1/113; G02B 1/115; G02B 1/14; G02B 1/18; G02F 1/133302; G02F 1/133305; G02F 1/133331; G02F 1/133308; G02F 1/133311; C23C 16/401; C23C 16/402; C23C 14/10; B32B 3/02; B32B 7/12;
(Continued)

(56) References Cited

U.S. PATENT DOCUMENTS 5,665,446 A * 9/1997 Sundet .............. B32B 17/10247
40/616
9,627,231 B2 * 4/2017 Narendrnath ............. B32B 7/14
(Continued)

FOREIGN PATENT DOCUMENTS

| | | |
|---|---|---|
| CN | 104541365 | 4/2015 |
| CN | 105073412 A | 11/2015 |

(Continued)

*Primary Examiner* — Z. Jim Yang
(74) *Attorney, Agent, or Firm* — Oblon, McClelland, Maier & Neustadt, L.L.P.

(57) ABSTRACT

A method for producing a substrate with a functional layer, the substrate with a functional layer including a substrate having a first main surface, second main surface, and end part, and a functional layer, the functional layer being formed on the first main surface and the end part, includes: laminating a resin base having an adhesive layer comprising a carbon-containing material, on at least a part of the second main surface of the substrate; and forming the functional layer by a dry deposition method. The resin base having the adhesive layer is laminated so that at least a part of a periphery of the resin base having the adhesive layer lies outside a periphery of the substrate. The resin base having the adhesive layer comprises an incision or opening in at least a part of a region which lies inside the periphery of the substrate.

12 Claims, 3 Drawing Sheets

(51) Int. Cl.
  *B32B 27/08* (2006.01)
  *B32B 27/28* (2006.01)
  *B32B 27/32* (2006.01)
  *C03C 17/42* (2006.01)
  *C23C 14/10* (2006.01)
  *C23C 14/12* (2006.01)
  *C23C 14/34* (2006.01)
  *C03C 21/00* (2006.01)

(52) U.S. Cl.
  CPC .............. *B32B 17/10* (2013.01); *B32B 27/08* (2013.01); *B32B 27/281* (2013.01); *B32B 27/32* (2013.01); *C03C 17/42* (2013.01); *C23C 14/10* (2013.01); *C23C 14/12* (2013.01); *B32B 2255/20* (2013.01); *C03C 21/002* (2013.01); *C03C 2217/76* (2013.01); *C03C 2218/119* (2013.01); *C03C 2218/151* (2013.01); *C03C 2218/156* (2013.01)

(58) Field of Classification Search
  CPC ........... B32B 3/266; B32B 17/00–1099; Y10T 428/24273–24331; Y10T 428/24777; G06F 1/1603; G06F 1/1626; G06F 1/1637–1654; G06F 1/1656; G06F 1/1658
  See application file for complete search history.

(56) References Cited

U.S. PATENT DOCUMENTS

| | | | | |
|---|---|---|---|---|
| 11,454,750 | B1* | 9/2022 | Blume | C09J 7/38 |
| 2006/0083894 | A1* | 4/2006 | Vetrovec | B29C 63/0047 |
| | | | | 428/137 |
| 2010/0026947 | A1* | 2/2010 | Kinoshita | G02F 1/134309 |
| | | | | 349/122 |
| 2010/0231821 | A1* | 9/2010 | Tsuji | G02F 1/133308 |
| | | | | 361/679.01 |
| 2011/0229694 | A1* | 9/2011 | Kanda | C09J 7/38 |
| | | | | 428/167 |
| 2013/0135877 | A1* | 5/2013 | Oh | G02F 1/133308 |
| | | | | 428/137 |
| 2014/0077181 | A1* | 3/2014 | Kim | H10K 59/00 |
| | | | | 257/40 |
| 2014/0120309 | A1* | 5/2014 | Ishii | B32B 15/08 |
| | | | | 428/137 |
| 2016/0016396 | A1* | 1/2016 | Kikuchi | G02F 1/133308 |
| | | | | 156/64 |
| 2016/0039183 | A1* | 2/2016 | Murashige | B32B 17/06 |
| | | | | 156/256 |
| 2016/0377914 | A1* | 12/2016 | Miyashita | G02F 1/133608 |
| | | | | 349/110 |
| 2017/0137671 | A1* | 5/2017 | Ogomi | C09J 7/20 |
| 2017/0197875 | A1* | 7/2017 | Fujii | G02B 27/0006 |
| 2018/0190734 | A1* | 7/2018 | Kang | B32B 7/12 |
| 2020/0103559 | A1* | 4/2020 | Fujii | C03C 21/002 |
| 2020/0158916 | A1* | 5/2020 | Hart | G02B 1/113 |

FOREIGN PATENT DOCUMENTS

| | | | | |
|---|---|---|---|---|
| JP | 2017-125876 A | | 7/2017 | |
| WO | WO-2013119737 A2 | * | 8/2013 | ............. B23K 26/40 |

* cited by examiner

SUBSTRATE WITH FUNCTIONAL LAYER AND PROCESS FOR PRODUCING THE SAME

TECHNICAL FIELD

The present invention relates to a substrate with a functional layer and a process for producing the same.

BACKGROUND ART

Nowadays, protective plates are increasingly used in mobile appliances such as tablet type personal computers (PCs) and smartphones and display devices such as liquid-crystal TVs and touch panels (hereinafter these appliances are often inclusively referred to as "display devices and the like") in order to protect the display screens and improve the appearance attractiveness.

From the standpoint of design attractiveness, there are cases where a design is employed in which the end part of a protective plate are exposed. In such cases, not only the main surface but also the end part of the protective plate are required to have improved appearance attractiveness.

The term "end part" herein means a side surface which are parallel with the thickness direction of the protective plate.

An antifouling layer is frequently formed in such protective plates in order to prevent the adhesion of soils such as fingerprints, sebaceous matter, and sweat. There are cases where an adhesion layer is formed between the antifouling layer and the protective plate in order to improve the wear resistance of the antifouling layer. There also are cases where antireflection properties or antiglare properties are imparted to the adhesion layer in order to further enhance the visibility of displayed images.

Such antifouling layers, adhesion layers, and the like (hereinafter inclusively referred to as "functional layers") are, in many cases, formed by a dry deposition method such as vapor deposition, sputtering, or CVD.

Patent Document 1 indicates that the wear resistance of an antifouling layer is improved by forming an adhesion layer so that an outermost layer of the adhesion layer is a carbon-containing silicon oxide layer which consists mainly of silicon oxide and contains carbon in a given proportion. Patent Document 1 discloses a method for introducing carbon into silicon oxide. In the method, an adhesive including a carbon-containing material is applied to a protective plate so as to protrude from the periphery of the protective plate and a silicon oxide layer for constituting an adhesion layer is then formed while keeping the pressure-sensitive adhesive in that state. Thus, a carbon component of the adhesive to be volatilized by the heat applied for forming the silicon oxide layer or due to plasma damage and incorporated into the silicon oxide layer.

CITATION LIST

Patent Literature

Patent Document 1: JP-A-2017-125876

SUMMARY OF INVENTION

Technical Problem

However, the present inventors newly found that there are cases where the formation of an adhesion layer or an antifouling layer by the method described in Patent Document 1 causes uneven discoloration to the end part of the protective plate. In the case where this protective plate is placed in a display device, with the end part of the protective plate being exposed, this poses a problem concerning appearance attractiveness in practical use.

Solution to the Problem

The present inventors diligently made investigations and, as a result, have discovered that the uneven discoloration of the end part can be diminished by using the following process.

A method for producing a substrate with a functional layer including a substrate having a first main surface, second main surface, and end part, and a functional layer includes formation of the functional layer on the first main surface and the end part. The formation of the functional layer includes forming a functional layer on the first main surface and the end part of the substrate by a dry deposition method in a state where a resin base having an adhesive layer including a carbon-containing material is disposed on the second main surface of the substrate so that at least a part of the periphery of the resin base lies outside the periphery of the substrate. The resin base having the adhesive layer has an incision or opening formed in at least a part of a region thereof which is in contact with the substrate.

Advantageous Effects of the Invention

According to this process, it is possible to introduce carbon into an adhesion layer and to provide a substrate with a functional layer in which the end part of the substrate is prevented from discoloring unevenly.

DESCRIPTION OF EMBODIMENTS

First, how this embodiment has been achieved is explained in more detail. The present inventors newly discovered that there are cases where the formation of an adhesion layer or an antifouling layer by the method described in Patent Document 1 causes uneven discoloration to the end part of the protective plate.

The present inventors diligently made investigations on the problem and, as a result, have found out the cause, which is as follows. The inventors have found that in cases where a protective plate to which adhesive layer is adherent is heated or subjected to plasma damage, minute air bubbles remaining in the portion where the adhesive layer is adherent to the protective plate expand and the expanded air bubbles move to end part of the protective plate and released during the deposition, thereby causing discoloration. More specifically, the following is presumed. An air bubble which has moved to an end part of the protective plate is locally discharged during the deposition of an adhesion layer or antifouling layer to locally affect the composition or film thickness of the adhesion layer or antifouling layer being deposited on the end part, resulting in a difference in color between this end part and other end part.

The present inventors have found, on the basis of that presumption, that the discoloration of the end part can be reduced by the following method. Incisions or openings are formed beforehand in at least a part of the adhesive layer and resin base. The adhesive layer and resin base are laminated to a protective plate so that the region where the incisions or openings have been formed lies on the main surface of the protective plate. Then, deposition is performed. In this method, expanded air bubbles resulting from heating or plasma damage move toward an end part and, during the movement, are released through any of the incisions or openings, without reaching the end part. As a result, the discoloration of the end part is reduced.

One aspect of the present invention is a method for producing a substrate with a functional layer including a substrate having a first main surface, second main surface, and end part, and a functional layer, the method including forming of the functional layer on the first main surface and the end part. The formation of the functional layer includes forming a functional layer on the first main surface and the end part of the substrate by a dry deposition method in a state where a resin base having an adhesive layer including a carbon-containing material is disposed on the second main surface of the substrate so that at least a part of the periphery of the resin base lies outside the periphery of the substrate. The resin base having the adhesive layer has an incision or opening formed in at least a part of a region thereof which is in contact with the substrate.

It is preferable that at least one of the incisions or openings lies inside the periphery of the substrate by 0.5 mm or more and 30 mm or less. Within this range, air bubbles which have moved from the center of the protective plate are removed without reaching the end part.

Another aspect of the present invention is a substrate with a functional layer, including a substrate having a first main surface, a second main surface, and an end part and further comprising, as the functional layer, an adhesion layer and an antifouling layer in this order on/above the first main surface and the end part, wherein the adhesion layer of the first main surface includes an outermost layer constituted of a carbon-containing silicon oxide layer which comprises silicon oxide as a main component and contains carbon in such a proportion that a number of carbon atoms contained is $5\times10^{18}$ atoms/cm$^3$ or more and $5\times10^{19}$ atoms/cm$^3$ or less, and wherein the end part of the substrate has a variation in color ΔE of 2 or less.

Another aspect of the present invention is a substrate with a functional layer, including a substrate having a first main surface, a second main surface, and an end part and further comprising, as the functional layer, an adhesion layer and an antifouling layer in this order on the first main surface and the end part, wherein the adhesion layer of the first main surface includes an outermost layer constituted of a carbon-containing silicon oxide layer which comprises silicon oxide as a main component and contains carbon in such a proportion that a number of carbon atoms contained is $5\times10^{18}$ atoms/cm$^3$ or more and $5\times10^{19}$ atoms/cm$^3$ or less, wherein a resin base having an adhesive layer containing a carbon-containing material is laminated on at least a part the second main surface of the substrate so that at least a part of a periphery of the resin base having the adhesive layer lies outside a periphery of the substrate, and wherein the end part of the glass substrate has a variation in color ΔE of 2 or less.

According to this aspect, a substrate is obtained in which the antifouling layer has satisfactory durability and the end part have evenness in color. The substrate is preferably a glass substrate.

This embodiment is explained in more detail.

Figure 2:
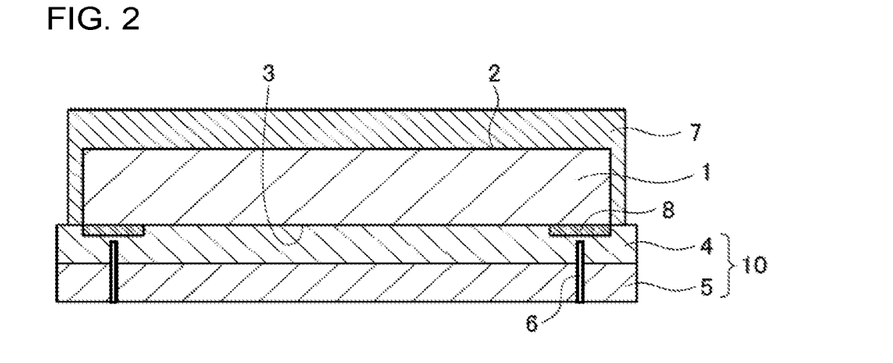
FIG. 2 is a cross-sectional view, taken on the line A-A of FIG. 1, in which the resin base having an adhesive layer is laminated to the substrate.
Figure 3:
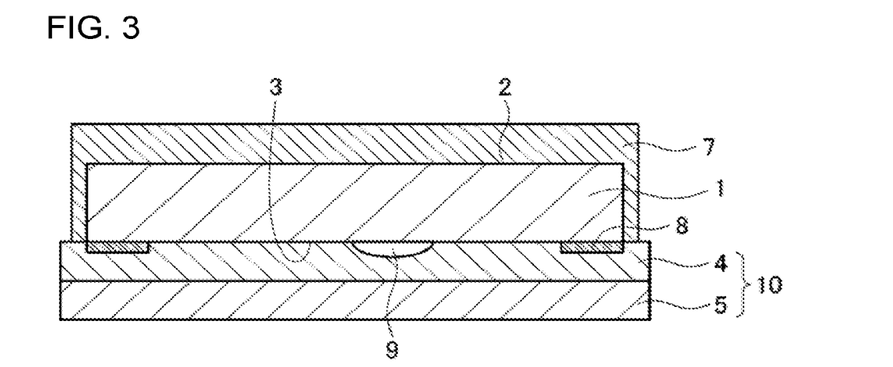
FIG. 3 is a view diagrammatically illustrating a state in which air is evolved between the substrate and the resin base during formation of a functional layer.

FIG. 2 is a cross-sectional view diagrammatically illustrating a state in which a resin base having an adhesive layer is laminated to a substrate and a functional layer is formed. The substrate 1 has a first main surface 2 and a second main surface 3. The resin base 5 is laminated to the second main surface 3 via the adhesive layer 4. A printed part 8 is provided on the second main surface 3 of the substrate. Incisions 6 is formed in the resin base 5 and adhesive layer 4. A functional layer 7 is formed on the first main surface of the substrate.

In FIG. 1 to FIG. 7, the adhesive layer 4 and the functional layer 7 are shown so as to have increased sizes for a concept explanation, although actually very thin.

Each constituent element of this embodiment is explained below in detail.

(Substrate)

The substrate 1 is not particularly limited so long as the substrate 1 is made of a transparent material. For example, it is preferred to use a substrate made of a glass or a resin or of a combination of these (e.g., a composite material or a laminated material).

Examples of the resin usable as the substrate 1 include acrylic resins such as poly(methyl methacrylate), aromatic polycarbonate resins such as bisphenol A carbonate resins, and aromatic polyester resins such as poly(ethylene terephthalate).

Examples of the glass substrate usable as the substrate 1 include a glass substrate made of a general glass including silicon dioxide as a main component, such as soda-lime silicate glass, aluminosilicate glass, borosilicate glass, alkali-free glass, and silica glass.

In the case of using a glass substrate as the substrate 1, it is preferable that the glass has a composition which renders the glass capable of being formed or being strengthened by a chemical strengthening treatment. The composition preferably contains sodium.

The glass is not particularly limited in the composition thereof, and glasses having various compositions can be used. Examples of the glass include aluminosilicate glasses having the following compositions as represented by mole % based on oxides.

(i) A glass including from 50 to 80% of $SiO_2$, from 2 to 25% of $Al_2O_3$, from 0 to 20% of $Li_2O$, from 0 to 18% of $Na_2O$, from 0 to 10% of $K_2O$, from 0 to 15% of MgO, from 0 to 5% of CaO, from 0 to 5% of $Y_2O_3$, and from 0 to 5% of $ZrO_2$;

(ii) A glass which includes from 50 to 74% of $SiO_2$, from 1 to 10% of $Al_2O_3$, from 6 to 14% of $Na_2O$, from 3 to 11% of $K_2O$, from 2 to 15% of MgO, from 0 to 6% of CaO, and from 0 to 5% of $ZrO_2$ and in which the total content of $SiO_2$ and $Al_2O_3$ is 75% or less, the total content of $Na_2O$ and $K_2O$ is from 12 to 25%, and the total content of MgO and CaO is from 7 to 15%;

(iii) A glass including from 68 to 80% of $SiO_2$, from 4 to 10% $Al_2O_3$, from 5 to 15% of $Na_2O$, from 0 to 1% of $K_2O$, from 4 to 15% of MgO, and from 0 to 1% of $ZrO_2$;

(iv) A glass which includes from 67 to 75% of $SiO_2$, from 0 to 4% of $Al_2O_3$, from 7 to 15% of $Na_2O$, from 1 to 9% of $K_2O$, from 6 to 14% of MgO, and from 0 to 1.5% of $ZrO_2$ and in which the total content of $SiO_2$ and $Al_2O_3$ is from 71 to 75%, the total content of $Na_2O$ and $K_2O$ is from 12 to 20%, and the content of CaO, if CaO is contained, is less than 1%.

The substrate 1 is preferably a glass substrate.

Processes for producing the glass substrate are not particularly limited. Desired raw materials for glass are introduced into a melting furnace and melted by heating at 1,500-1,600° C. The molten glass is refined and then fed to a forming device, formed into a plate shape, and cooled slowly. Thus, the glass substrate can be produced. Forming methods for producing the glass substrate are not particularly limited, and use can be made, for example, of a downdraw process (e.g., an overflow downdraw process, a slot downdraw process, or a redraw process), a float process, a rolling-out process, or a pressing process.

In the case of using a glass substrate as the substrate 1, it is preferred to give a chemical strengthening treatment to the obtained glass substrate in order to heighten the strength thereof.

Methods for the chemical strengthening treatment is not particularly limited. The main surface of the glass substrate is subjected to ion exchange to form a surface layer in which compressive stress remains. Specifically, at a temperature not higher than the glass transition temperature, alkali metal ions having a small ionic radius (e.g., Li ions or Na ions) contained in the glass near the main surfaces of the substrate are replaced with alkali metal ions having a larger ionic radius (e.g., Na or K ions for replacing Li ions, or K ions for replacing Na ions). Thus, compressive stress remains in the main surface of the glass substrate to improve the strength of the glass substrate.

The glass substrate to be used as the substrate 1 preferably satisfies the requirements shown below. Such requirements can be satisfied by performing the chemical strengthening treatment.

The glass substrate has a surface compressive stress (hereinafter referred to as "CS") of preferably 400 MPa or higher and 1,200 MPa or less, more preferably 700 MPa or higher and 900 MPa or less. In the case where the CS is 400 MPa or higher, this glass substrate has sufficient strength for practical use. In the case where the CS is 1,200 MPa or less, the glass substrate can withstand the compressive stress of itself and the glass substrate does not rupture by itself. In the case where the substrate 1 with a low-reflection film of the present invention is to be used as the front-side substrate (cover glass) of a display device, the CS of the glass substrate is especially preferably 700 MPa or higher and 850 MPa or less.

The glass substrate has a depth of the stress layer (hereinafter referred to as "DOL") of preferably 15 μm or larger and 50 μm or less, more preferably 20 μm or larger and 40 μm or less. In the case where the DOL is 15 μm or larger, the glass substrate does not readily receive scratches to rupture, even when a keen jig such as a glass cutter is used. In the case where the DOL is 50 μm or less, this glass substrate can withstand the compressive stress of itself and the glass substrate does not rupture by itself. In the case where the substrate 1 with a low-reflection film of the present invention is to be used as the front-side substrate (cover glass) of a display device, the DOL of the glass substrate is especially preferably 25 μm or larger and 35 μm or less.

In the case where the glass substrate contains $Li_2O$, the strength thereof can be further improved by subjecting this glass substrate to two or more chemical strengthening treatments.

Specifically, for example, a first treatment is performed in which the glass substrate is brought into contact with an inorganic-salt composition mainly including, for example, sodium nitrate to conduct ion exchange between Na and Li. Subsequently, in a second treatment, the glass substrate is brought into contact with an inorganic-salt composition mainly including, for example, potassium nitrate to conduct ion exchange between K and Na. This method is preferred because a compressive stress layer having a large value of DOL and having high surface stress can be formed.

The thickness of the substrate 1 can be suitably selected in accordance with applications. For example, in the case of a resin substrate, a glass substrate, or the like, the thickness is preferably 0.1 mm or larger and 5 mm or less, more preferably 0.2 mm or larger and 2 mm or less.

In the case where a glass substrate is used as the substrate 1 and is to be subjected to the chemical strengthening treatment, the thickness of the glass substrate is usually preferably 5 mm or less, more preferably 3 mm or less, from the standpoint of effectively performing the treatment.

In the case where the substrate 1 is a glass substrate, the dimensions thereof can be suitably selected in accordance with applications. For use as the cover glass of a mobile appliance, the glass substrate preferably has a size of 30 mm×50 mm or larger and 300 mm×400 mm or less and a thickness of 0.1 mm or larger and 2.5 mm or less. For use as the cover glass of a display device, the glass substrate preferably has a size of 50 mm×100 mm or larger and 2,000 mm×1,500 mm or less and a thickness of 0.5 mm or larger and 4 mm or less.

With respect to shape, the substrate 1 may have not only a flat shape, such as that shown in the drawings, but also a shape having a curved surface, as of a substrate having one or more bent portions. Recently, various appliances (e.g., TVs, personal computers, smartphones, and automotive navigation systems) each equipped with an image display device having a curved screen surface have appeared.

In the case where the substrate 1 has a curved surface, the entire surface of the substrate 1 may be curved, or the surface of the substrate 1 may be configured of one or more curved portions and one or more flat portions. Examples of the substrate 1 in which the entire surface is curved include a substrate 1 having a cross-section of a circular-arc shape.

In the case where the substrate 1 has a curved surface, the radius of curvature (hereinafter referred to also as "R") thereof can be suitably set in accordance with applications of the substrate 1, the kind thereof, etc., and is not particularly limited. However, the R is preferably 25,000 mm or less, more preferably 1 mm or larger and 5,000 mm or less, especially preferably 5 mm or larger and 3,000 mm or less. In the case where the R is less than the upper limit, this substrate 1 has better design attractiveness than flat plates. In the case where the R is larger than the lower limit, a functional layer 7 can be evenly formed also on the curved surface.

The substrate 1 may have a printed part 8 on the second main surface 3. The printed part 8 may be a light-blocking part which hides any portion that may lie within the field of view to constitute an obstacle to viewing displayed images, such as wiring circuits arranged around the periphery of the display panel, and which thereby heightens the visibility of displayed images and the appearance attractiveness. The printed part 8 may be one including characters, a pattern, etc.

The printed part 8 is formed by printing an ink. Usable printing methods include bar coating, reverse coating, gravure coating, die coating, roll coating, screen printing, ink-jet printing, and the like. The screen printing or ink-jet printing is preferred because printing by these methods is easy and is possible on various substrates and can be performed in accordance with the sizes of substrates.

The ink to be used is not particularly limited. Usable as the ink is an inorganic ink containing a ceramics, etc. and an organic ink containing a colorant, such as a dye or a pigment, and an organic resin.

Examples of the ceramics contained in the inorganic ink include oxides such as chromium oxide and iron oxide, carbides such as chromium carbide and tungsten carbide, carbon black, and mica. A printed part is obtained by melting an ink including both the ceramics and silica, printing the molten ink so as to form a desired pattern, and then burning the printed ink. This inorganic ink necessitates melting and burning steps and is commonly used as an ink exclusively for glasses.

The organic ink is a composition including a dye or pigment and an organic resin. Examples of the organic resin include: homopolymers such as epoxy resins, acrylic resins, poly(ethylene terephthalate), polyethersulfones, polyarylates, polycarbonates, transparent ABS resins, phenolic resins, acrylonitrile/butadiene/styrene resins, polyurethanes, poly(methyl methacrylate), polyvinyls, poly(vinyl butyral), polyetheretherketones, polyethylene, polyesters, polypropylene, polyamides, and polyimides; and resins each constituted of a copolymer of any of the monomers for those resins with one or more monomers copolymerizable therewith. As the dye or pigment, any dye or pigment having light-blocking properties can be used without particular limitations.

Of the organic inks and the inorganic inks, the organic inks are preferable because of the lower burning temperature thereof. From the standpoint of chemical resistance, the organic inks containing pigment are preferred.

(Resin Base)

The resin base 5 of this embodiment is not particularly limited so long as it is a material which withstands heating or a plasma in forming the functional layer 7 which is described later. For example, suitable resins are polyimide (PI) resins, poly(ethylene terephthalate) (PET) resins, polyethylene (PE) resins, and polypropylene (PP) resins. PI resins and PET resins are preferred from the standpoint of higher heat resistance, while PE resins and PP resins are preferred from the standpoint of cost. It is preferable that the resin base 5 is in the form of a film, and use of a film of any of these resins is suitable.

The thickness of the resin base 5 is not particularly limited. However, the thickness is preferably 5 μm or larger and 500 μm or less, more preferably 10 μm or larger and 200 μm or less, still more preferably 15 μm or larger and 100 μm or less. In the case where the thickness is within that range, the resin base 5 sufficiently withstands heating or a plasma and it is easy to peel the resin base 5 and the adhesive layer 4, which is described below, from the substrate 1 after formation of the functional layer 7.

The resin base 5 has an adhesive layer 4 on at least a part of at least one main surface thereof.

By applying the resin base 5 to the substrate 1 via the adhesive layer 4, not only the substrate 1 can be made easy to convey but also protection of the second main surface 3 and efficient introduction of carbon can be attained in forming the functional layer 7 which is described later.

From the standpoints of cost and handleability, it is preferable that the adhesive layer 4 is formed over the whole area of one surface of the resin base 5.

Hereinafter, the resin base 5 and the adhesive layer 4 are sometimes inclusively called a "resin base with an adhesive layer 10".

Examples of the material of the adhesive layer 4 include a silicone-based adhesive including a silicone rubber or a silicone resin, an acrylic adhesive synthesized by polymerizing or copolymerizing one or more acrylic ester monomers, and a polyurethane-based adhesive including a polyurethane. When the substrate 1 is incorporated into a display device or the like, the second main surface 3 thereof is bonded with an adhesive or the like. Because of this, the second main surface 3 preferably is low in water and oil repellency from the standpoint of bondability. In view of this, the material of the adhesive layer 4 is preferably an acrylic or polyurethane-based adhesive among those shown above.

From the standpoint of balance between the strength of bonding between the substrate 1 and the resin base 5 and releasability required in peeling off the adhesive layer 4 and the resin base 5 after forming the functional layer, the adhesive force of the adhesive layer 4 is preferably 0.02 N/25 mm or more and 10 N/25 mm or less, more preferably 0.05 N/25 mm or more and 0.5 N/25 mm, in terms of the strength of adhesion to an acrylic plate which is measured by 180-degree peeling in accordance with JIS Z 0237 (2009).

The thickness of the adhesive layer 4 is preferably 5 μm and 50 μm or less, from the standpoints of the strength of bonding between the substrate 1 or printed part 8 and the resin base 5 and of releasability.

Usable as the resin base with an adhesive layer 10 is, for example, No. 6500 (trade name; manufactured by Hitachi Maxell, Ltd.) as a polyimide tape with a silicone-based adhesive, RP-207 (trade name; manufactured by Nitto Denko Corp.) and EC-9000AS (trade name; manufactured by Sumiron Co., Ltd.) as PET films with an acrylic adhesive, UA-3004AS (trade name; manufactured by Sumiron Co., Ltd.) as a PET film with a polyurethane-based pressure-sensitive adhesive, or the like.

For laminating the resin base with an adhesive layer 10 to the substrate 1, a laminator or the like is used. While conveying the substrate 1, the resin base with an adhesive layer 10 is continuously supplied to the second main surface 3 and placed thereon and the stack is then pressurized. Thus, the resin base with an adhesive layer 10 can be applied. Laminating conditions in this operation are not particularly limited. For example, the laminating is conducted under the conditions of a conveying speed for the substrate 1 of 1 m/min or more and 5 m/min or less and a pressing force of 1 kgf/cm$^2$ or more and 10 kgf/cm$^2$ or less in terms of linear pressure.

The resin base with an adhesive layer 10 is laminated so that at least a part of the periphery of the resin base with an adhesive layer 10 lies outside the periphery of the substrate 1. This manner enables carbon to be volatilized from the adhesive layer 4 by heating or plasma formation in forming the functional layer 7 which is described later. As a result, the functional layer 7 containing carbon can be formed.

It is preferable that the entire periphery of the resin base with an adhesive layer 10 lies outside the periphery of the substrate 1, from the standpoint of protecting the second main surface 3 of the substrate 1 in forming the functional layer 7.

The distance between the portion of the periphery of the resin base with an adhesive layer 10 which lies outside the periphery of the substrate 1 and the periphery of the substrate 1 is preferably 0.5 mm or larger and 10 mm or less, more preferably 1 mm or larger and 5 mm or less. This arrangement enables the second main surface 3 of the substrate or the printed part 8 to be protected without fail and renders efficient introduction of carbon into the functional layer 7 possible.

In the case where a part of the periphery of the resin base with an adhesive layer 10 lies inside the periphery of the substrate 1, the distance between that portion of the periphery of the resin base with an adhesive layer 10 and the periphery of the substrate 1 is preferably 0.5 mm or larger and 10 mm or less, more preferably 0.5 mm or larger and 3 mm or less. When the distance is within that range, the second main surface 3 of the substrate 1 or the printed part 8 can be effectively protected.

The resin base with an adhesive layer 10 has an incision or opening in at least a part of the region where the substrate 1 is to be laminated. The incision or opening enables air bubbles evolved in forming the functional layer 7, which is described later, to be removed without reaching the end part.

Figure 1:
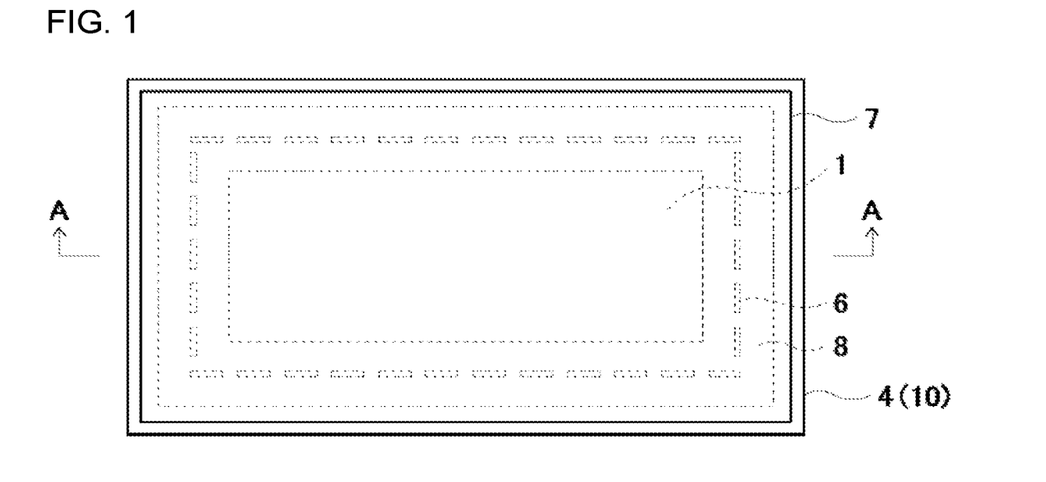
FIG. 1 is a plan view diagrammatically illustrating a states in which a resin base having an adhesive layer is laminated to a substrate.

It is preferable that the incision or opening is the incision, from the standpoint of protecting the second main surface 3 of the substrate 1. FIG. 1 and FIG. 2 show the incision 6.

From the standpoint of easily peeling off the adhesive layer 4 and the resin base 5 after formation of the functional layer 7, it is preferred to form incision 6 so that the resin base with an adhesive layer 10 is not separated into a plurality of pieces by the incision 6. More specifically, it is preferable that incisions 6 are formed, for example, in a broken-line arrangement.

In the case where the incisions or openings are a broken-line arrangement, the cycle of the broken-line arrangement is preferably 5 mm or larger and 20 mm or less, more preferably 7 mm or larger and 15 mm or less. The proportion of the length of the incision or opening to the cycle is preferably 30% or more and 80% or less, more preferably 45% or more and 75% or less. This arrangement not only enables air bubbles evolved in forming a functional layer 7 to be removed without fail, but also prevents the resin base with an adhesive layer 10 from rupturing at the broken-line incision or opening upon peeling from the substrate 1 after formation of the functional layer 7.

The cycle of the broken-line arrangement means a distance between the one end of the incision or opening and one end of the adjacent incision or opening including the incision or opening.

The incision or opening lies in a region extending preferably from 0.5 to 25 mm, more preferably from 1 to 15 mm, in terms of distance from the periphery of the substrate. By thus arranging the incision or opening, air bubbles are prevented from being evolved in a large amount in the area between end part of the substrate 1 and the incision or opening, thereby producing the effect of reducing the discoloration of the end part.

In the case where the substrate 1 has a printed part 8, it is preferable that the incision or opening lies over the region of the printed part 8. The arrangement of the incision or opening over the region of the printed part 8 is preferred because even if particles for forming a functional layer come on the second main surface 3 side and enter through the incision or opening during formation of the functional layer, the particles are invisible through the display screen surface.

The position of the incision 6 to be formed is suitably determined in accordance with how the substrate 1 is to be incorporated into a display device or the like. For example, in the case where the display device or the like has such a design that three end parts of the substrate 1 are exposed after the substrate 1 is incorporated thereinto, then the position of incision is formed so as to prevent the discoloration of these three end parts.

In the case where the whole end part is required to have evenness in color, it is preferable that the incisions or opening are formed in a broken-line arrangement along the whole periphery of the substrate 1. This arrangement of the incisions or openings enables expanded air bubbles to be removed without reaching the end part, regardless of which direction the air bubbles move in.

Methods for forming the incision or opening are not particularly limited. Examples thereof include: a method in which the incision or opening having a given shape is formed while moving a cutter blade or the like; and a method in which the incision or opening is formed using press-cutting blades, e.g., Thompson blades, disposed beforehand in a given shape.

The formation of the incision or opening may be conducted before the resin base is laminated to the substrate 1 or after the lamination. It is preferred to conduct the formation thereof before laminating the resin base to the substrate 1, from the standpoint of not giving scratches to the substrate 1.

Figure 6:
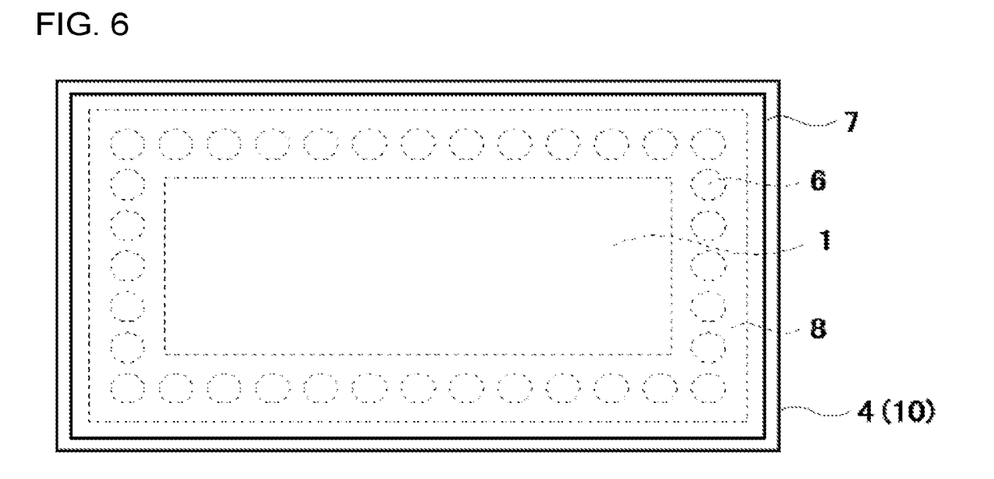
FIG. 6 is a view showing a modification of this embodiment.
Figure 7:
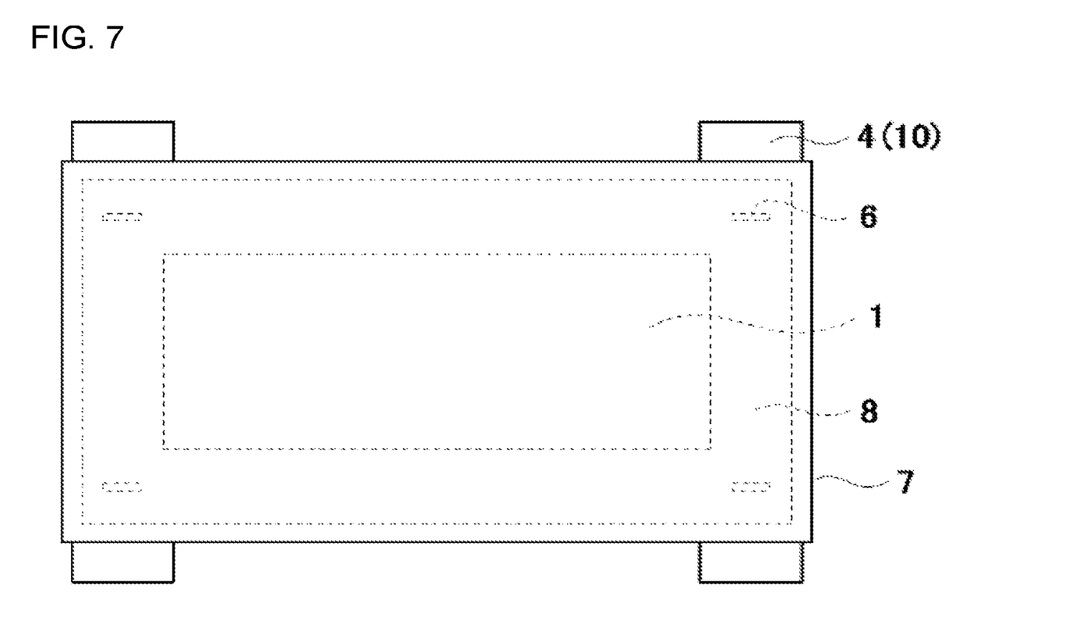
FIG. 7 is a view showing another modification of this embodiment.

Modification examples of the resin base with an adhesive layer according to this embodiment are shown in FIG. 6 and FIG. 7. A resin base with an adhesive layer 10 which has an opening arranged along the periphery of the substrate 1, as shown in FIG. 6, is also effective in removing air bubbles. A plurality of resin bases with adhesive layers 10 may be laminated to a part of the substrate 1, as shown in FIG. 7.

(Functional Layer)

A functional layer 7 is formed on the first main surface 2 and the end part of the substrate 1. The functional layer 7 is constituted of a single layer or has a multilayer structure composed of stacked layers. Examples of the functional layer 7 include an antifouling layer, an antiglare layer, an antireflection layer, and an adhesion layer. Each functional layer is explained below in detail.

[Antifouling Layer]

The antifouling layer is either a film which prevent organic matter or inorganic matter from adhering to the surface thereof or a layer which has an effect wherein even when organic matter or inorganic matter has adhered to the surface thereof, the adherent substance can be easily removed by clearing such as wiping.

It is preferable that the antifouling layer is formed on the surface of the adhesion layer which is described later. The antifouling layer is not particularly limited so long as this layer is capable of imparting nonfouling properties to the substrate 1. However, the antifouling layer is preferably constituted of a fluorine-containing organosilicon compound coating film obtained by curing a fluorine-containing organosilicon compound by a hydrolytic condensation reaction.

The thickness of the antifouling layer is not particularly limited. However, in the case where the antifouling layer is constituted of a fluorine-containing organosilicon compound coating film, the thickness is preferably 2 nm or larger and 20 nm or less, more preferably 2 nm or larger and 15 nm or less, still more preferably 2 nm or larger and 10 nm or less, in terms of the thickness of the film on the first main surface 2. In the case where the thickness in terms of the thickness of the film on the first main surface 2 is 2 nm or larger, the first main surface 2 of the substrate 1 is in the state of being evenly coated with the antifouling layer and withstands practical use from the standpoint of abrasion resistance. Meanwhile, in the case where the thickness thereof in terms of the thickness of the film on the first main surface 2 is 20 nm or less, the substrate 1 in the state of having the antifouling layer formed thereon has satisfactory optical properties including haze.

For forming the antifouling layer, any composition which contains a fluorine-containing hydrolyzable silicon compound and which is capable of forming the antifouling layer by a dry deposition method can be used without particular limitations. The composition for antifouling-layer formation may contain optional ingredients besides the fluorine-containing hydrolyzable silicon compound, or may be constituted only of one or more fluorine-containing hydrolyzable silicon compounds. Examples of the optional ingredients include hydrolyzable silicon compounds having no fluorine atom (hereinafter referred to as "non-fluorinated hydrolyzable silicon compounds"), which may be used so long as the effects of this embodiment are not lessened thereby, and catalysts.

When incorporating a fluorine-containing hydrolyzable silicon compound and a non-fluorinated hydrolyzable silicon compound, which is optional, into a composition for coating film formation, these compounds may be incorporated as such or may be incorporated as products of partial hydrolysis and condensation thereof. A mixture of these compounds with products of partial hydrolysis and condensation thereof may be incorporated into a composition for coating film formation.

In the case of using two or more hydrolyzable silicon compounds in combination, these compounds may be incorporated as such into a composition for coating film formation or may each be incorporated as a product of partial hydrolysis and condensation. Two or more of these compounds may be incorporated as a product of partial hydrolysis and co-condensation thereof. The composition may be a mixture of these compounds, the products of partial hydrolysis and condensation, and the product of partial hydrolysis and co-condensation. However, the products of partial hydrolysis and condensation and product of partial hydrolysis and co-condensation to be used are ones each having a degree of polymerization that renders film formation by a dry deposition method possible. Hereinafter, the term "hydrolyzable silicon compounds" is used so as to not only mean the compounds themselves but also imply any of such products of partial hydrolysis and condensation and products of partial hydrolysis and co-condensation.

The fluorine-containing hydrolyzable silicon compound to be sued for forming the fluorine-containing organosilicon compound coating film according to this embodiment is not particularly limited so long as the fluorine-containing organosilicon compound coating film obtained therefrom has antifouling properties including water repellency and oil repellency.

Specifically, examples of the fluorine-containing hydrolyzable silicon include fluorine-containing hydrolyzable silicon compounds each having one or more groups selected from the group consisting of a perfluoropolyether group, a perfluoroalkylene group, and a perfluoroalkyl group. These groups are each present as a fluorine-containing organic group bonded to the silicon atom of a hydrolyzable silyl group either via a connecting group or directly. Advantageously usable commercial products of such fluorine-containing organosilicon compounds each having one or more groups selected from the group consisting of a perfluoropolyether group, a perfluoroalkylene group, and a perfluoroalkyl group (fluorine-containing hydrolyzable silicon compounds) include KP-801 (trade name; manufactured by Shin-Etsu Chemical Co., Ltd), X-71 (trade name; manufactured by Shin-Etsu Chemical Co., Ltd), KY-130 (trade name; manufactured by Shin-Etsu Chemical Co., Ltd), KY-178 (trade name; manufactured by Shin-Etsu Chemical Co., Ltd), KY-185 (trade name; manufactured by Shin-Etsu Chemical Co., Ltd), KY-195 (trade name; manufactured by Shin-Etsu Chemical Co., Ltd), AFLUID (registered trademark) S-550 (trade name; manufactured by AGC Inc.), and OPTOOL (registered trademark) DSX (trade name; manufactured by Daikin Industries, Ltd.). It is more preferred to use KY-195, OPTOOL DSX, or S-550 among these.

[Adhesion Layer]

The adhesion layer is arranged between the substrate 1 and the antifouling layer in order to improve the durability of the antifouling layer. It is preferable that the adhesion layer includes an outermost layer including silicon oxide as a main component, from the standpoint of adhesion to the antifouling layer. The adhesion layer can be made to simultaneously have antireflection performance or the like by forming the adhesion layer by laminating one layer or a plurality of layers.

The term "main component" herein means a component contained in the layer in an amount of 80% by mass or larger.

That layer in the adhesion layer which is in contact with the antifouling layer preferably is a carbon-containing silicon oxide layer which includes silicon oxide as a main component and contains carbon atoms in a concentration of $5 \times 10^{18}$ atoms/cm$^3$ or more and $5 \times 10^{19}$ atoms/cm$^3$ or less. In the case where the layer in the adhesion layer which is in contact with the antifouling layer is a carbon-containing silicon oxide layer having a carbon atom concentration within that range, the antifouling layer tenaciously adheres to the substrate 1 via the adhesion layer, and the functional layer 7 hence has excellent wear resistance. It is more preferable that the carbon-containing silicon oxide layer contains carbon atoms in a concentration of $6 \times 10^{18}$ atoms/cm$^3$ or more and $4 \times 10^{19}$ atoms/cm$^3$ or less.

The carbon-containing silicon oxide layer can be formed using the same method as that for forming a low-refractive-index layer from silicon oxide ($SiO_2$) in forming the antireflection layer which is described later. For example, the resin base with an adhesive layer 10 is laminated to the second main surface 3 of the substrate 1 so that at least a part of the periphery thereof lies outside the periphery of the substrate 1, as described above, and the silicon oxide layer as a component of the adhesion layer is formed on the substrate 1 in that state. As a result, a carbon component volatilizes, due to heating or plasma damage during the formation of the silicon oxide layer, from the portion of the resin base with an adhesive layer 10 which lies outside the periphery of the substrate 1 and the volatilized carbon is incorporated into the silicon oxide layer. In this manner, a carbon-containing silicon oxide layer containing carbon atoms in the given proportion can be formed. The content of carbon atoms can be regulated by changing, for example, the area of that portion of the resin base with an adhesive layer 10 which lies outside the periphery of the substrate 1.

As described above, a carbon component contained in the resin base with an adhesive layer 10 volatilizes upon heating or exposure to plasma and is incorporated into the silicon oxide layer. It is hence possible to form a silicon oxide layer into which an element other than carbon, e.g., fluorine (F), is incorporated, by selecting a material for constituting the adhesive layer 4. In the case where a material containing an element to be incorporated into a silicon oxide layer is used besides the adhesive layer 4 and the silicon oxide layer is formed while keeping that material exposed to heat or plasma, then the silicon oxide layer thus formed can contain that element.

In the case where the adhesion layer is a stacking, the adhesion layer can be configured as a low-reflection film which is composed of stacked layers including the low-refractive-index layer and high-refractive-index layer that is described later and in which the layer to be in contact with the antifouling layer is a low-refractive-index layer made of carbon-containing silicon oxide ($SiO_2$). In this case, the low-reflection film functions as an adhesion layer being a stacking.

In the case where the adhesion layer functions as a low-reflection film, the silicon oxide used as the layer in contact with the antifouling layer has a refractive index of usually 1.43 or more and 1.50 or less, when containing no carbon atoms. However, the silicon oxide may contain an impurity to such a degree that the refractive index is 1.40 or more and 1.53 or less, preferably 1.45 or more and 1.52 or less.

The surface roughness of the layer of the adhesion layer which is to be in contact with the antifouling layer is preferably 3 nm or less, more preferably 2 nm or less, still more preferably 1.5 nm or less, in terms of arithmetic mean roughness (Ra). In the case where the Ra thereof is 3 nm or less, this surface roughness makes the antifouling layer have such surface irregularities that a cloth or the like can deform along the surface irregularities and hence imposes a load approximately evenly on the entire surface of the antifouling layer. The antifouling layer is thereby prevented from peeling off and has improved wear resistance.

In examining the adhesion layer for arithmetic mean roughness (Ra) when the first main surface 2 has surface irregularities, a measurement region may be set so that the surface irregularities are not detected. In the case where the diameter of circular holes or root-mean-square surface roughness (RMS) is within the preferred range, the Ra of the adhesion layer can be made determinable, for example, by setting a measurement region which does not include any ridge of the surface irregularities.

In the case where the first main surface 2 of the substrate 1 has surface irregularities, the layer of the adhesion layer which is to be in contact with the antifouling layer has a square-mean-root surface roughness (RMS) of preferably 10 nm or higher, more preferably 20 nm or higher. The RMS is preferably 1,500 nm or less, more preferably 1,000 nm or less, still more preferably 500 nm or less, especially preferably 200 nm or less. In the case where the RMS is within that range, not only the antifouling layer is prevented from peeling off and has improved wear resistance but also glitter-preventive properties or antiglare properties can also be attained. In determining the RMS of the surface irregularities, it is desirable that a measurement region is selected so as to sufficiently include circular holes therein unlike the measurement region selected for determining the arithmetic-mean surface roughness (Ra) of the adhesion layer described above. Since the surfaces of the adhesion layer and antifouling layer are sufficiently smooth, the value of RMS determined by the method described above, with the adhesion layer or antifouling layer present over the first main surface 2, can be regarded as equal to the RMS of the surface irregularities.

[Low-Reflection Layer]

The low-reflection layer is a film which not only has a reflectance-reducing effect to reduce glaringness due to light reflection in the screen but also improves transmission of light from display devices or the like to improve the visibility of images displayed on the display devices or the like.

The substrate 1 according to this embodiment is preferably equipped with a low-reflection layer between the first main surface 2 and the antifouling layer. The configuration of the low-reflection film is not particularly limited so long as light reflection can be reduced thereby. For example, the low-reflection layer has a configuration composed of a stacking including a high-refractive-index layer having a refractive index at 550-nm wavelength of 1.9 or higher and a low-refractive-index layer having a refractive index at 550-nm wavelength of 1.6 or less. The low-reflection layer may be constituted of one low-refractive-index layer only.

The low-reflection film may have a configuration including one high-refractive-index layer and one low-refractive-index layer, or may have a configuration including two or more high-refractive-index layers and two or more low-refractive-index layers. In the case where the low-reflection film includes two or more high-refractive-index layers and two or more low-refractive-index layers, it is preferable that the two or more high-refractive-index layers and the two or more low-refractive-index layers is alternately stacked.

From the standpoint of enhancing the low-reflection properties, it is preferable that the low-reflection layer is a stacking composed of a plurality of stacked layers. For example, the stacking as a whole is composed of preferably two or more and ten or less of layers, more preferably two or more and eight or less of layers, still more preferably four or more and six or less of layers. The stacking preferably is one composed of stacked layers including one or more high-refractive-index layers and one or more low-refractive-index layers as described above. The total number of the high-refractive-index layer(s) and low-refractive-index layer(s) is preferably within that range.

The materials of the high-refractive-index layers and low-refractive-index layers are not particularly limited, and can be suitably selected while taking account of the degree of required low-reflection properties, production efficiency, etc. For constituting the high-refractive-index layers, one or more materials selected from niobium oxide ($Nb_2O_5$), titanium oxide ($TiO_2$), zirconium oxide ($ZrO_2$), tantalum oxide ($Ta_2O_5$), and silicon nitride ($Si_3N_4$) is advantageously used. For constituting the low-refractive-index layers, one or more materials selected from silicon oxide ($SiO_2$), a material including a mixed oxide of Si and Sn, a material including a mixed oxide of Si and Zr, and a material including a mixed oxide of Si and Al is advantageously used.

Preferred from the standpoints of production efficiency and refractive index is a configuration in which the high-refractive-index layers are layers including, as a main component, one material selected from among niobium oxide, tantalum oxide, and silicon nitride and the low-refractive-index layers are layers including silicon oxide as a main component.

As described above, the low-reflection layer can be rendered usable also as an adhesion layer by constituting the outermost layer thereof so as to include silicon oxide as a main component.

[Methods for Forming the Functional Layer]

The functional layer 7 according to this embodiment is formed by a dry deposition method. Examples of the dry deposition method include a vapor deposition method, an ion-beam-assisted vapor deposition method, ion plating, sputtering, and a plasma CVD method. Preferred of these is vapor deposition or sputtering.

In the case where the functional layer 7 is composed of a plurality of layers, the functional layer 7 may be formed using two or more of those methods in combination. For example, use may be made of a method in which an adhesion layer is formed by sputtering and an antifouling layer is thereafter formed by vapor deposition.

In the case of forming an antifouling layer, it is preferred to use vapor deposition. Preferred of vapor deposition methods are a resistance-heating method and an electron-beam vapor deposition method.

In the case of forming an adhesion layer or a low-reflection layer, it is preferred to use vapor deposition of sputtering. It is more preferable that either ion-assisted vapor deposition in which a film is deposited while forming a plasma, among vapor deposition methods, or sputtering is used in order to obtain a denser film.

Generally used methods for sputtering are magnetron sputtering methods, and especially preferred of these are pulse magnetron sputtering, AC magnetron sputtering, and post-oxidation magnetron sputtering.

In the case where such methods are used, a functional layer which is dense and has an accurately regulated film thickness can be obtained.

When a functional layer 7 is to be formed on the substrate 1, the resin base with an adhesive layer 10 is laminated to the substrate 1 as described above. There are cases where after the resin base with an adhesive layer 10 is laminated to the substrate 1, air bubbles remain slightly between the second main surface 3 of the substrate 1 and the adhesive layer 4 although not visually recognizable.

There are cases where such air bubbles, even when not visually recognizable before formation of a functional layer 7, move, unite, and expand during the formation of a functional layer 7 by a dry deposition method. The air bubbles are prone to expand especially when heating or plasma formation is conducted in forming a functional layer 7 or when introduced into a device for dry deposition and the device is evacuated. As a result, the air bubbles, for example, become the air 9 shown in FIG. 3.

Figure 4:
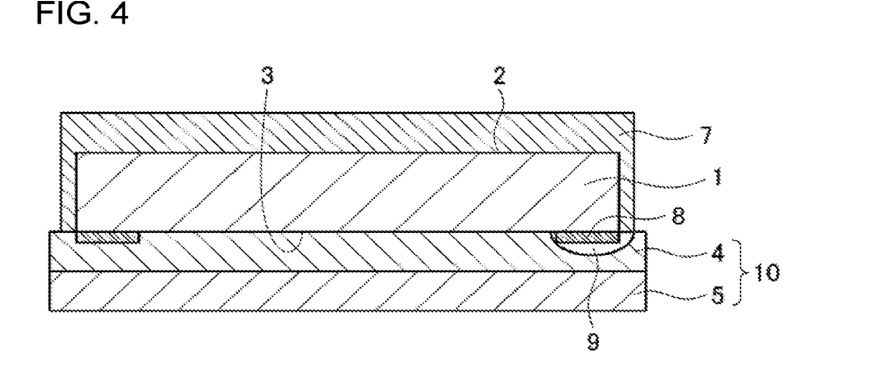
FIG. 4 is a view diagrammatically illustrating a state in which the air in FIG. 3 has moved to an end part.

The air 9 moves to the end part of the substrate 1 during the formation of a functional layer and is released from the end part of the substrate 1 as shown in FIG. 4. As a result, only the portion of the end part which lies in the vicinity of the release site is affected by the air 9 to locally change the film thickness, refractive index, degree of oxidation, etc. of the functional layer 7 which is being formed on the end part. This deposition results in a phenomenon in which that the portion of the end part that lies near the air release site differs in color from the other portions of the end part. This is a presumed mechanism by which the end part are discolored in forming a functional layer 7 by the conventional technique.

In contrast, in this embodiment, the resin base with an adhesive layer 10 has an incision 6, as shown in FIG. 1 or FIG. 2.

Figure 5:
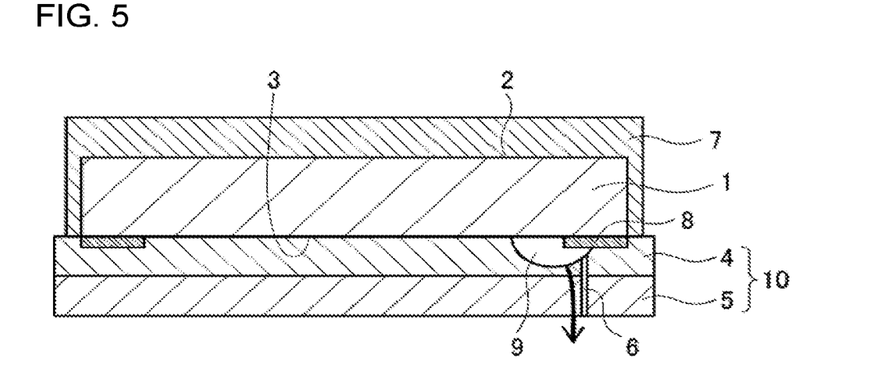
FIG. 5 is a view diagrammatically illustrating a state in which the air has reached an incision in this embodiment.

In this case, air 9 which has moved and reached an incision 6 is released through the incision 6. The air 9 thus released does not reach the end part of the substrate 1. As a result, the film thickness, refractive index, etc. of the functional layer 7 which is being formed on the end part are less apt to be affected and the end part can have evenness in color throughout.

The end part of the substrate 1 has a variation in color $\Delta E$ of preferably 2 or less, more preferably less than 1. $\Delta E$ is defined by $$\Delta E = \sqrt{[(\Delta a^*)^2 + (\Delta b^*)^2]}$$

$\Delta a^*$ and $\Delta b^*$ are differences between maximum and minimum values of $a^*$ and $b^*$, respectively, in the end part $a^*$ and $b^*$ indicate a color $(a^*, b^*)$ defined in JIS Z 8781 (2013).

EXAMPLES

The present invention is explained below in detail by reference to Examples, etc., but the invention should not be construed as being limited by the following Examples, etc.

A square plate glass DT (DRAGONTRAIL (registered trademark); manufactured by AGC Inc.; aluminosilicate glass for chemical strengthening) which had a thickness of 1.3 mm and had a pair of opposed main surfaces having a size of 130 mm×280 mm was used as a substrate. A glass substrate with a functional layer was obtained by the procedure described in each of the following Examples and Comparative Example. Hereinafter, one of the main surfaces of the glass substrate is referred to as "first main surface" and the other is referred to as "second main surface".

Example 1

The glass substrate was subjected to (1) a chemical strengthening treatment, (2) formation of a black printed part, (3) formation of an adhesion layer (low-reflection layer), and (4) formation of an antifouling layer in this order in the manners shown below, thereby obtaining a glass substrate with a functional layer.

(1) Chemical Strengthening Treatment

The glass substrate was immersed for 2 hours in molten potassium nitrate salt heated at 450° C. Thereafter, the glass substrate was pulled up from the molten salt and slowly cooled to room temperature over 1 hour, thereby obtaining a chemically strengthened glass substrate. The chemically strengthened glass substrate thus obtained had a surface compressive stress (CS) of 730 MPa and a depth of the stress layer (DOL) of 30 μm.

(2) Formation of Printed Part

Next, a black frame pattern having a width of 25 mm was printed by screen printing on four peripheral portions of the second main surface of the glass substrate in the following manner to form a black printed part. First, a black ink (trade name, GLSHF; manufactured by Teikoku Ink) was applied in a thickness of 3 μm with a screen printer and then dried by holding at 150° C. for 10 minutes to form a first printed part. Subsequently, the same black ink was applied in a thickness of 3 μm to the first printed part in the same manner and then dried by holding at 150° C. for 40 minutes to form a second printed part. Thus, a black printed part composed of the first printed part and the second printed part laminated was formed, thereby obtaining a glass substrate equipped with the printed part at the outer peripheral portion of the second main surface.

(3) Formation of Adhesion Layer (Low-Reflection Layer (AR))

Next, an adhesion layer was formed on the first main surface and the end part of the glass substrate in the following manner.

First, a PET film coated with a polyurethane-based adhesive and having a size of 134 mm×284 mm (UA-3000AS, manufactured by Sumiron Co., Ltd.) was prepared as a resin base with an adhesive layer.

The resin base was made of a PET resin and had a thickness of 38 μm. The adhesive layer was made of a polyurethane-based adhesive and had a thickness of 5 μm.

The resin base with an adhesive layer had an adhesive force, in application to an acrylic plate, of 0.05 N/25 mm.

Subsequently, incisions in a broken-line arrangement were formed in the resin base with an adhesive layer at the portion inside the periphery of the resin base by 5 mm. The cycle in the broken-line arrangement was 7.5 mm, and each cycle included an incision length of 5 mm.

This resin base with an adhesive layer was laminated with a laminator to the second main surface of the glass substrate equipped with the printed part, as shown in FIG. 1.

When laminated, the resin base with an adhesive layer was positioned so that the peripheral edges of the resin base protruded from the periphery of the glass substrate by 2 mm. Consequently, the incisions formed in a broken-line arrangement laid 3 mm inward from the periphery of the glass substrate.

After the laminating, the laminate was visually examined. As a result, air bubbles or the like was unable to be observed between the glass substrate and the resin base with an adhesive layer.

Thus, a glass substrate having a printed part, to which the resin base with an adhesive layer having broken-line incisions formed along the periphery the glass substrate was laminated, was obtained.

This enables a carbon-containing component to be volatilized from the portion protruding from the substrate by heating or plasma during formation of an adhesion layer and incorporated into the adhesion layer. In Example 1, the area of the exposed portion of the adhesive layer was 4.5% of the area of the first main surface of the glass substrate.

Next, an adhesion layer was deposited by the following steps. First, while a mixed gas obtained by mixing argon gas with 10% by volume oxygen gas was being introduced into a chamber, a cylindrical niobium oxide target having a length of 1,000 mm and an outer diameter of 150 mm (trade name, NBO Target; manufactured by AGC Ceramics Co., Ltd.) was used to conduct AC rotary dual magnetron sputtering under the conditions of a pressure of 0.5 Pa, a frequency of 40 kHz, and a power of 15 kW. Thus, a high-refractive-index layer (first layer) made of niobium oxide (niobia) and having a thickness of 13 nm was formed.

Subsequently, while a mixed gas obtained by mixing argon with 40% by volume oxygen gas was being introduced into the chamber, a cylindrical silicon target having a length of 1,000 mm and an outer diameter of 150 mm (manufactured by AGC Ceramics Co., Ltd.) was used to conduct AC rotary dual magnetron sputtering under the conditions of a pressure of 0.3 Pa, a frequency of 40 kHz, and a power of 10 kW. Thus, a low-refractive-index layer (second layer) made of silicon oxide (silica) and having a thickness of 35 nm was formed on the high-refractive-index layer.

Subsequently, a high-refractive-index layer made of niobium oxide (niobia) and having a thickness of 115 nm was formed on the low-refractive-index layer, i.e., the second layer, in the same manner as for the first layer. Next, a low-refractive-index layer made of silicon oxide (silica) and having a thickness of 80 nm was formed in the same manner as for the second layer. Thus, an adhesion layer (low-reflection film) composed of the two niobium oxide (niobia) layers and the two silicon oxide (silica) layers, i.e., four stacked layers in total, was formed. In this adhesion layer, the low-refractive-index layer as the outermost layer was a carbon-containing silicon oxide layer.

(4) Formation of Antifouling Layer

Next, an antifouling layer was deposited in the following manner. The glass substrate was used in the state where the resin base with an adhesive layer was laminated to the glass substrate. An antifouling layer was deposited on the first main surface and was simultaneously deposited also on the side surface efficiently. First, a material for forming fluorine-containing organosilicon compound films was introduced as a material for antifouling-layer formation into a heating vessel. Thereafter, the heating vessel was evacuated with a vacuum pump for 10 hours or longer to remove the solvent from the solution to convert said material into a composition for forming fluorine-containing organosilicon compound films (hereinafter referred to as "composition for antifouling-layer formation"). As the composition for antifouling-layer formation, KY-185 (manufactured by Shin-Etsu Chemical Co., Ltd.) was used.

Subsequently, the heating vessel containing the composition for antifouling-layer formation was heated to 270° C. After 270° C. had been reached, the heated state was maintained for 10 minutes until the temperature became stable. Next, the glass substrate on which the adhesion layer had been formed was set in a vacuum chamber. Thereafter, the composition for antifouling-layer formation was suppled toward the adhesion layer (low-reflection film) of the glass substrate from a nozzle connected to the heating vessel containing the composition for antifouling-layer formation, thereby conducting deposition.

The deposition was conducted while measuring the film thickness with a quartz oscillator monitor disposed in the vacuum chamber, until the fluorine-containing organosilicon compound film on the adhesion layer came to have a film thickness of 4 nm. Thereafter, the glass substrate was taken out of the vacuum chamber.

Example 2

A glass substrate which had undergone (1) a chemical strengthening treatment and (2) formation of a black printed part in the same manners as in Example 1 was used and laminated with a resin base with an adhesive layer under the following conditions.

First, a PET film coated with an acrylic adhesive and having a size of 136 mm×286 mm (EC-9000AS, manufactured by Sumiron Co., Ltd.) was used as a resin base with an adhesive layer. The PET film had a thickness of 38 μm, and the adhesive layer had a thickness of 6 μm. The resin base with an adhesive layer had an adhesive force, in application to an acrylic plate, of 0.08 N/25 mm.

Subsequently, incisions in a broken-line arrangement were formed in the resin base with an adhesive layer at the portion inside the periphery of the resin base by 4 mm, along the whole periphery thereof. The cycle in the broken-line arrangement was 10 mm, and each cycle included an incision length of 5 mm.

This resin base with an adhesive layer was then laminated with a laminator to the second main surface of the glass substrate equipped with the printed part, as shown in FIG. 1.

When laminated, the resin base with an adhesive layer was positioned so that the peripheral edges of the resin base protruded from the periphery of the glass substrate by 3 mm. Consequently, the incisions formed in a broken-line arrangement laid 1 mm inward from the periphery of the glass substrate.

After the laminating, the laminate was visually examined. As a result, air bubbles or the like was unable to be observed between the substrate and the resin base with an adhesive layer.

Thus, a glass substrate having a printed part, to which the resin base with an adhesive layer having broken-line incisions formed along the periphery the glass substrate was laminated, was obtained. In Example 2, the area of the exposed portion of the adhesive layer was 6.9% of the area of the first main surface of the glass substrate.

Subsequently, an adhesion layer (low-reflection layer) was formed in the same manner as in Example 1. Thus, a glass substrate was obtained in which the adhesion layer (low-reflection layer) was the only layer formed on the first main surface.

Example 3

A glass substrate which had undergone (1) a chemical strengthening treatment and (2) formation of a black printed part in the same manners as in Example 1 was used and laminated with a resin base with an adhesive layer under the following conditions.

First, a PI film coated with a silicone-based adhesive and having a size of 134 mm×284 mm was used as a resin base with an adhesive layer. The PI film had a thickness of 25 μm, and the adhesive layer had a thickness of 35 μm. The resin base with an adhesive layer had an adhesive force of 5.8 N/25 mm.

Subsequently, incisions in a broken-line arrangement were formed in the resin base with an adhesive layer at the portion inside the periphery of the resin base by 7 mm, along the whole periphery thereof. The cycle in the broken-line arrangement was 7.5 mm, and each cycle included an incision length of 5 mm.

This resin base with an adhesive layer was then laminated with a laminator to the second main surface of the glass substrate equipped with the printed part, as shown in FIG. 1.

When laminated, the resin base with an adhesive layer was positioned so that the peripheral edges of the resin base protruded from the periphery of the glass substrate by 2 mm. Consequently, the incisions formed in a broken-line arrangement laid 5 mm inward from the periphery of the glass substrate.

After the laminating, the laminate was visually examined. As a result, air bubbles or the like was unable to be observed between the substrate and the resin base with an adhesive layer.

Thus, a glass substrate having a printed part, to which the resin base with an adhesive layer having broken-line incisions formed along the periphery the glass substrate was laminated, was obtained. In Example 3, the area of the exposed portion of the adhesive layer was 4.5% of the area of the first main surface of the glass substrate.

Subsequently, in this Example 3, an antifouling layer was formed in the same manner as in Example 1, without forming an adhesion layer.

Example 4

A glass substrate which had undergone (1) a chemical strengthening treatment and (2) formation of a black printed part in the same manners as in Example 1 was used and laminated with a resin base with an adhesive layer under the following conditions.

First, the same resin base with an adhesive layer as in Example 1 was used. Incisions were formed in a broken-line arrangement at the portion inside the periphery of the resin base by 22 mm. The cycle in the broken-line arrangement and the incision length were the same as in Example 1.

Subsequently, the substrate and the resin base with an adhesive layer were laminated to each other with a laminator in the same manner as in Example 1. When laminated, the resin base with an adhesive layer was positioned so that the peripheral edges of the resin base protruded from the periphery of the glass substrate by 2 mm. Consequently, the incisions formed in a broken-line arrangement laid 20 mm inward from the periphery of the glass substrate.

Subsequently, an adhesion layer (low-reflection layer) and an antifouling layer were formed in the same manners as in Example 1.

Example 5

A glass substrate which had undergone (1) a chemical strengthening treatment and (2) formation of a black printed part in the same manners as in Example 1 was used and laminated with a resin base with an adhesive layer under the following conditions.

First, two sheets of a PI film coated with a silicone-based adhesive and having a size of 20 mm×140 mm (No. 6500, manufactured by Sliontec Ltd.) were used as resin base with an adhesive layers. The PI film had a thickness of 25 μm, and the adhesive layer had a thickness of 30 μm. The resin base with an adhesive layers had an adhesive force of 5.8 N/25 mm.

Subsequently, an 18-mm incisions were formed in each resin base with an adhesive layer at the position inside each short side by 7 mm.

Subsequently, each resin base with an adhesive layer was laminated to the second main surface of the glass substrate having a printed part in parallel with the short sides of the glass substrate as shown in FIG. 7. This application was conducted so that the long side of each resin base with an adhesive layer which was nearer to the corresponding short side of the glass substrate laid 2 mm inward from the short side of the glass substrate, and that the short sides of each resin base with an adhesive layer each protruded outward from the corresponding long side of the glass substrate by 5 mm Consequently, the incisions laid 2 mm inward from the long sides of the glass substrate.

After laminating, the laminate was visually examined. As a result, air bubbles or the like was unable to be observed between the substrate and each resin base with an adhesive layer.

Thus, a glass substrate having a printed part, to which the resin base with an adhesive layer was laminated as shown in FIG. 7, was obtained. In Example 5, the area of the exposed portions of the adhesive layers was 1.1% of the area of the first main surface of the glass substrate.

Subsequently, an adhesion layer (low-reflection layer) and an antifouling layer were formed in the same manners as in Example 1.

Comparative Example 1

An adhesion layer and an antifouling layer were formed on the first main surface of a glass substrate having a printed part to which a resin base with an adhesive layer was laminated, in the same manners as in Example 1, except that no incisions were formed in the resin base with an adhesive layer.

(Evaluation)

Each glass substrate with a functional layer of Examples 1 to 5 and Comparative Example 1 thus obtained was evaluated with respect to the following items in the following manners.

[Occurrence or Nonoccurrence of End Part Discoloration]

The whole end part of each glass substrate was visually examined and evaluated for local discoloration. The visual examination was made in an environment having an illuminance of 1,500 lx, with the glass substrate being held 30 cm apart from the eyes.

[Determination of Variation in Color of End Part]

The variation in color of the end part was evaluated in the following manner. First, spectral reflectances were acquired using a microspectrophotometer (USPM RUIII, manufactured by Olympus Co., Ltd.) as a measuring device. In preparation for the measurement, a position of the substrate which gave a maximum value of reflectance was determined beforehand to regulate the substrate so that values of regular reflectance were able to be acquired. From the spectral reflectances, a color (a*, b*) was determined.

Measurement portions in each substrate were determined in the following manner. First, with respect to each glass substrate in which a discoloration had been visually observed in the end part, the discolored portions and portions that had not discolored were selected and each examined for color.

With respect to each substrate in which no discoloration in the end part was visually observed, the center of each of the four end parts was examined for color. From the color (a*,b*) data thus obtained, the variation in color of each substrate was determined using the following equation.

$$\Delta E = \sqrt{[(\Delta a^*)^2 + (\Delta b^*)^2]}$$

In the equation, Δa* and Δb* are differences between maximum and minimum values of a* and b*, respectively, in the data on each substrate.

[Determination of Carbon Content in Outermost Layer of Adhesion Layer]

With respect to each of Examples 1, 2, 4, and 5 and Comparative Example 1, the carbon content in an outermost layer of the adhesion layer was determined in the following manner.

First, an oxygen plasma treatment was performed and then an ultraviolet (UV)/ozone treatment was performed, in order to remove both the antifouling layer formed over the glass substrate and any organic surface foulants. Only either of these treatments may be performed in accordance with the film thickness of the antifouling layer and the degree of surface fouling.

In the oxygen plasma treatment, a low-temperature ashing device (Type LTA-102, manufactured by Yanaco Technical Science Co., Ltd.) was used. The treatment conditions included a high-frequency output of 50 W, an oxygen flow rate of 50 mL/min, and a treatment period of 60 minutes.

In the UV/ozone treatment, an ultraviolet irradiator PL30-200 (manufactured by Sen Engineering Co., Ltd.) was used, and UB2001D-20 was used as a power supply for the ultraviolet irradiator. The treatment conditions included an ultraviolet wavelength of 254 nm and a treatment period of 10 minutes.

The glass laminate which had undergone the UV/ozone treatment was examined by X-ray photoelectron spectroscopy to ascertain that there was no peak assigned to fluorine. Thus, the antifouling surface layer was ascertained to have been removed.

Next, the carbon content of an outermost layer of the adhesion layer was determined with an SIMS (secondary-ion mass spectrometer) by the following procedure.

(1) First, reference samples having known carbon concentrations were produced by ion implantation. A substrate having the same composition as a film to be evaluated or a substrate on which the film was deposited was prepared separately from the sample to be evaluated. It was preferable that the reference samples to be prepared had carbon concentrations which were as low as possible. Here, silica glass substrates were prepared for $SiO_2$ film evaluation.

For the ion implantation, IMX-3500RS (manufactured by ULVAC, Inc.) was used. For $SiO_2$ film evaluation, $^{12}C$ ions were implanted into the silica glass substrate at an energy of 110 keV. The amount of $^{12}C$ ion implantation was $1.5 \times 10^{15}$ ions/cm$^2$.

(II) Next, a sample to be evaluated and the reference sample produced in (I) above, which had known carbon concentrations, were simultaneously conveyed into the SIMS and examined to acquire depth-direction profiles regarding $^{12}C^-$ and $^{30}Si^-$ intensity. A relative sensitivity factor (RSF) was determined from the depth-direction profile of the reference sample, and the determined RSF was used to obtain a carbon-concentration profile of the test sample. For $SiO_2$ film evaluation, use was made of the carbon-concentration profile of the test sample obtained from the RSF of the silica glass substrate into which $^{12}C$ ions had been implanted.

For the examination with the SIMS, ADEPT 1010 (manufactured by ULVAC-PHI Inc.) was used. In the examination with the SIMS, irradiation with primary ions was conducted using $Cs^+$ as a primary-ion species, under the conditions of an accelerating voltage of 5 kV, a current of 50 mA, an incidence angle of 60° with the line normal to the plane of the sample, and a primary-ion raster size of 400×400 µm$^2$. With respect to detection of secondary ions, a detection region was set so as to be 80×80 µm$^2$ (4% of the primary-ion raster size) and the field aperture of the detector was set at 1 to detect secondary ions having negative polarity. For this detection, a flood gun was used. It was preferred to keep the degree of vacuum in the device as high as possible in order to ensure measurement accuracy. The degree of vacuum in the main chamber of the SIMS before initiation of this examination was $1.6 \times 10^{-7}$ Pa.

The rate of primary-ion sputtering (irradiation) on the silica glass substrate in which $^{12}C$ ions had been implanted was 0.30 nm/sec. It was preferable that a sputtering rate which was as high as possible, like the degree of vacuum in the device, was used in the examination in order to ensure measurement accuracy.

Subsequently, the sputtering time as the abscissa of the carbon-concentration profile of the test sample obtained in (II) was converted to depth in the following manner. Each reference sample which had been analyzed was examined with a stylus type surface shape analyzer (Dektak 150, manufactured by Veeco Inc.) to measure the depths of recesses (craters) and thereby determine the rate of primary-ion sputtering on the reference sample. For $SiO_2$ film evaluation, the sputtering time as abscissa was converted to depth using the rate of sputtering on the silica glass substrate into which $^{12}C$ ions had been implanted.

Subsequently, from the carbon-concentration profile of the test sample in which the sputtering time as abscissa had been thus converted to depth, the carbon concentration of an outermost layer was calculated in the following manner.

First, in preparation for calculating the carbon concentration in the $SiO_2$ film as an outermost layer, a profile was produced by converting the sputtering time as abscissa into depth using the rate of sputtering on the silica glass substrate into which $^{12}C$ ions had been implanted, and converting the secondary-ion intensity as ordinate into concentration using the RSF of the silica glass substrate into which $^{12}C$ ions had been implanted. The C-concentration profile obtained here was effective for the C contained in the $SiO_2$ film. The outermost layer had carbon adsorbed thereonto, and the adsorbed carbon was detected in the examination with the SIMS. An average carbon concentration in an outermost-layer region which excluded a region where the adsorbed carbon was detected and which had an even $^{30}Si^-$ secondary-ion intensity and extended to a layer just over a glass-substrate-side layer where the Nb secondary-ion intensity began to increase was taken as the carbon concentration. The average carbon concentration was thus determined three times for each sample, and an average value of these was taken as the carbon (C) atom concentration in the $SiO_2$ film.

Details of the treatments given to the glass substrates in Examples 1 to 4 and Comparative Example 1 and the results of the evaluation are summarized in Table 1.

observed in the end part, the discoloration being problematic in practical use. Furthermore, the end part had a variation in color ΔE as high as 4.5.

In each of Examples 1 to 5, those portions of the printed part which had overlain incisions had discolored to a visually observable degree, as compared with the other portions of the printed part. This discoloration is presumed to be because during the formation of the functional layer, particles for forming the functional layer came on the second main surface side of the glass substrate to adhere to the portions of the printed part which lay in the broken-line incisions or the plasma which had been formed came on said

TABLE 1

|  | Ex. 1 | Ex. 2 | Ex. 3 | Ex. 4 | Ex. 5 | Comparative Ex. 1 |
|---|---|---|---|---|---|---|
| Substrate | DT | DT | DT | DT | DT | DT |
| Resin base | PET | PET | PI | PE | PI | PET |
| Material of adhesive layer | Polyurethane | Acrylic | Silicone | Polyurethane | Silicone | Polyurethane |
| Amount of protrusion of adhesive layer and resin base from substrate (mm) | 2 | 3 | 2 | 2 | 5 | 2 |
| Position of incision or broken line | Whole periphery | Whole periphery | Whole periphery | Whole periphery | Two sides | None |
| Distance from periphery of substrate to incision or broken line (mm) | 3 | 1 | 5 | 20 | 2 | — |
| Cycles of broken line (mm) | 7.5 | 10 | 7.5 | 7.5 | — | — |
| Incision length in cycle of broken-line arrangement (mm) | 5 | 5 | 5 | 5 | (18) | — (0) |
| Proportion of incision length in broken-line cycle (length %) | 67% | 50% | 67% | 67% | — | — (0%) |
| Functional layer 1 | Adhesion layer (low-reflection layer) | Low-reflection layer | Antifouling layer | Adhesion layer (low-reflection layer) | Adhesion layer (low-reflection layer) | Adhesion layer (low-reflection layer) |
| Method of forming functional layer 1 | AC magnetron sputtering | AC magnetron sputtering | Vapor deposition | AC magnetron sputtering | AC magnetron sputtering | AC magnetron sputtering |
| Functional layer 2 | Antifouling layer | — | — | Antifouling layer | Antifouling layer | Antifouling layer |
| Method of forming functional layer 2 | Vapor deposition | — | — | Vapor deposition | Vapor deposition | Vapor deposition |
| Occurrence or nonoccurrence of end part discoloration (visual examination) | Not occurred | Not occurred | Not occurred | Slightly occurred | Not occurred | Occurred |
| Color difference between discolored portion and normal portion (in the case of no discoloration in visual examination, color difference of each center of the four end parts) | 0.1 | 0.15 | 0.02 | 0.5 | 0.18 | 4.5 |
| Carbon content of silicon oxide of outermost layer of adhesion layer (×$10^{18}$ atoms/cm$^3$) | 7.0 | 12.1 | — | 8.2 | 5.1 | 7.6 |

As Table 1 shows, the end part of the glass substrates of Examples 1 to 5 had no or an only slight discoloration, which was not problematic in practical use. The end part of each substrate were ascertained to have a variation in color of 0.5 or less. Furthermore, with respect to each of Examples 1, 2, and 4, in which an adhesion layer (low-reflection layer) had been formed, an uppermost layer of the adhesion layer was ascertained to have a C/Si atomic number ratio, as determined by XPS, of $5.1 \times 10^{18}$ to $12.1 \times 10^{18}$ (atoms/cm$^3$).

Although a slight discoloration was observed in Example 4, this is presumed to be because the broken-line incisions had laid at a distance of 20 mm from the periphery of the substrate, which had been larger than in the other Examples. Specifically, it is presumed that due to the larger distance between the broken-line incisions and the end part, air bubbles which had been evolved in a slight amount between the substrate end part and the broken-line incisions reached the end part to cause the slight discoloration.

In contrast, in the Comparative Example 1, in which no broken-line incisions had been formed, a discoloration was side to cause damage to those surfaces of the printed part which lay in the broken-line incisions.

In Example 5, soils had adhered to the second main surface of the glass substrate after the formation of the functional layer. In contrast, no soil adhesion was observed in Examples 1 to 4. It is presumed that in Example 5, resin base with an adhesive layers had laminated to only a part of the second main surface of the glass substrate and, hence, the region not covered with the resin base with an adhesive layers had been unprotected during the formation of the functional layer, resulting in the adhesion of soils. It was thus found that it was more preferred to laminate a resin base with an adhesive layer to the whole second main surface of the glass substrate as in Examples 1 to 4.

Furthermore, in Example 5, the resin base with an adhesive layers ruptured at the incisions when peeled from the glass substrate after the formation of the functional layer. In contrast, in Examples 1 to 4, the resin base with an adhesive layers were able to be easily peeled off without rupturing. It was presumed that in Example 5, the incisions had too large a length of 18 mm, which was 90% of the tape width of 20 mm, and hence the resin base with an adhesive layers ruptured due to the peel force. It was thus found that by suitably setting the proportion of incisions to non-incision portions as in Examples 1 to 4, the resin base with an adhesive layer was made easy to peel off.

While the present invention has been described in detail and with reference to specific embodiments thereof, it will be apparent to one skilled in the art that various changes and modifications can be made therein without departing from the spirit and scope thereof.

This application is based on Japanese Patent Application No. 2019-007026 filed on Jan. 18, 2019, the entire subject matter of which is incorporated herein by reference.

REFERENCE SIGNS LIST

1: Substrate
2: First main surface of substrate
3: Second main surface of substrate
4: Adhesive layer
5: Resin base
6: Incision, opening
7: Functional layer
8: Printed part
9: Air
10: Resin base with an adhesive layer

The invention claimed is:

1. A coated substrate comprising:
a substrate having a first main surface, a second main surface, and an end part;
a low-reflection film and an antifouling layer deposited in this order on/above the first main surface and the end part of the substrate; and
a resin base laminated on at least a part of the second main surface of the substrate with an adhesive layer containing a carbon-containing material so that at least a part of a periphery of the resin base and the adhesive layer lies outside a periphery of the substrate;
wherein
the substrate is a glass substrate having a thickness of 0.2 to 5 mm,
the low-reflection film of the first main surface comprises an outermost layer constituted of a carbon-containing silicon oxide layer which comprises silicon oxide as a main component and contains carbon in such a proportion that a number of carbon atoms contained is $5 \times 10^{18}$ atoms/cm$^3$ or more and $5 \times 10^{19}$ atoms/cm$^3$ or less,
wherein
the resin base and the having an adhesive layer contains an incision or opening which extends vertically within the adhesive layer to a main surface of the resin base opposing the adhesive layer,
the incision or opening lies only in a region extending from 0.5 to 25 mm in terms of distance from the periphery of the substrate, and
the end part of the substrate has a variation in color ΔE of 2 or less.

2. The coated substrate according to claim 1, wherein the substrate comprises a printed part; and
the incision or opening lies only in the region of the printed part.

3. A method for producing a substrate with a functional layer, the substrate with a functional layer comprising a substrate having a first main surface, second main surface, and end part, and a functional layer, the functional layer being formed on the first main surface and the end part, the method comprising:
laminating a resin base on at least a part of the second main surface of the substrate with an adhesive layer comprising a carbon containing material; and
forming the functional layer by a dry deposition method,
wherein at least a part of a periphery of the resin base and the adhesive layer lies outside a periphery of the substrate, and
wherein the resin base and the adhesive layer comprises an incision or opening in at least a part of a region which lies inside the periphery of the substrate, wherein the incision or opening in the resin base having an adhesive layer extends vertically within the adhesive layer to a main surface of the resin base opposing the adhesive layer, and
the incision or opening lies only in a region extending from 0.5 to 25 mm in terms of distance from the periphery of the substrate.

4. The method according to claim 3, wherein the incisions or openings are a broken-line arrangement.

5. The method according to claim 4, wherein a cycle of the broken-line arrangement is 5 mm or larger and 20 mm or less, and
wherein a proportion of a length of the incision or opening to the cycle of the broken line is 30% or more and 80% or less.

6. The method according to claim 3, wherein a vapor deposition method is used as the dry deposition method, and an adhesion layer or an antifouling layer is formed as the functional layer.

7. The method according to claim 6, wherein the vapor deposition method includes heating or formation of plasma.

8. The method according to claim 3, wherein a sputtering is used as the dry deposition method, and an adhesion layer is formed as the functional layer.

9. The method according to claim 3, wherein the substrate is a glass substrate.

10. The method according to claim 9, wherein the glass substrate is a chemically strengthened glass.

11. The method according to claim 9, wherein the glass substrate has a printed part on the second main surface.

12. The method according to claim 11, wherein the incision or opening lies over the printed part.

* * * * *